United States Patent [19]

Hornung

[11] 4,367,423

[45] Jan. 4, 1983

[54] RESET SIGNAL GENERATOR

[75] Inventor: Richard E. Hornung, Louisville, Ky.

[73] Assignee: General Electric Company, Louisville, Ky.

[21] Appl. No.: 222,824

[22] Filed: Jan. 6, 1981

[51] Int. Cl.³ .................. H03K 17/22; G01R 19/165; G01R 19/175
[52] U.S. Cl. .................................. 307/597; 307/350; 307/354; 340/663
[58] Field of Search .................. 307/296 R, 273, 350, 307/354, 363, 597, 268; 340/636, 660, 661, 663

[56] References Cited

U.S. PATENT DOCUMENTS 4,232,236 11/1980 Yomogida et al. ............. 307/296 R
4,300,065 11/1981 Remedi et al. .................. 307/296 R Primary Examiner—John Zazworsky Attorney, Agent, or Firm—H. Neil Houser; Radford M. Reams

[57] ABSTRACT

A reset generator circuit including a power monitor subcircuit which provides first and second logic level signals which specify the power supply as being above or below a preselected threshold level. A logic circuit comprising a series of interconnected NAND gates responds to the output signals generated by the power monitor subcircuit and to a signal from a capacitor charge monitor circuit. The capacitor charge monitor circuit develops logic signals which reflect the magnitude of the voltage across a capacitor which is part of a timing circuit. The control signal output from the logic circuit drives one input to a reset control gate and also controls the charge on the capacitor. The other input to the reset gate is also driven by the charge monitor circuit. The reset gate operates a switching element which provides the proper reset signal adapted for coupling to a microprocessor.

8 Claims, 1 Drawing Figure

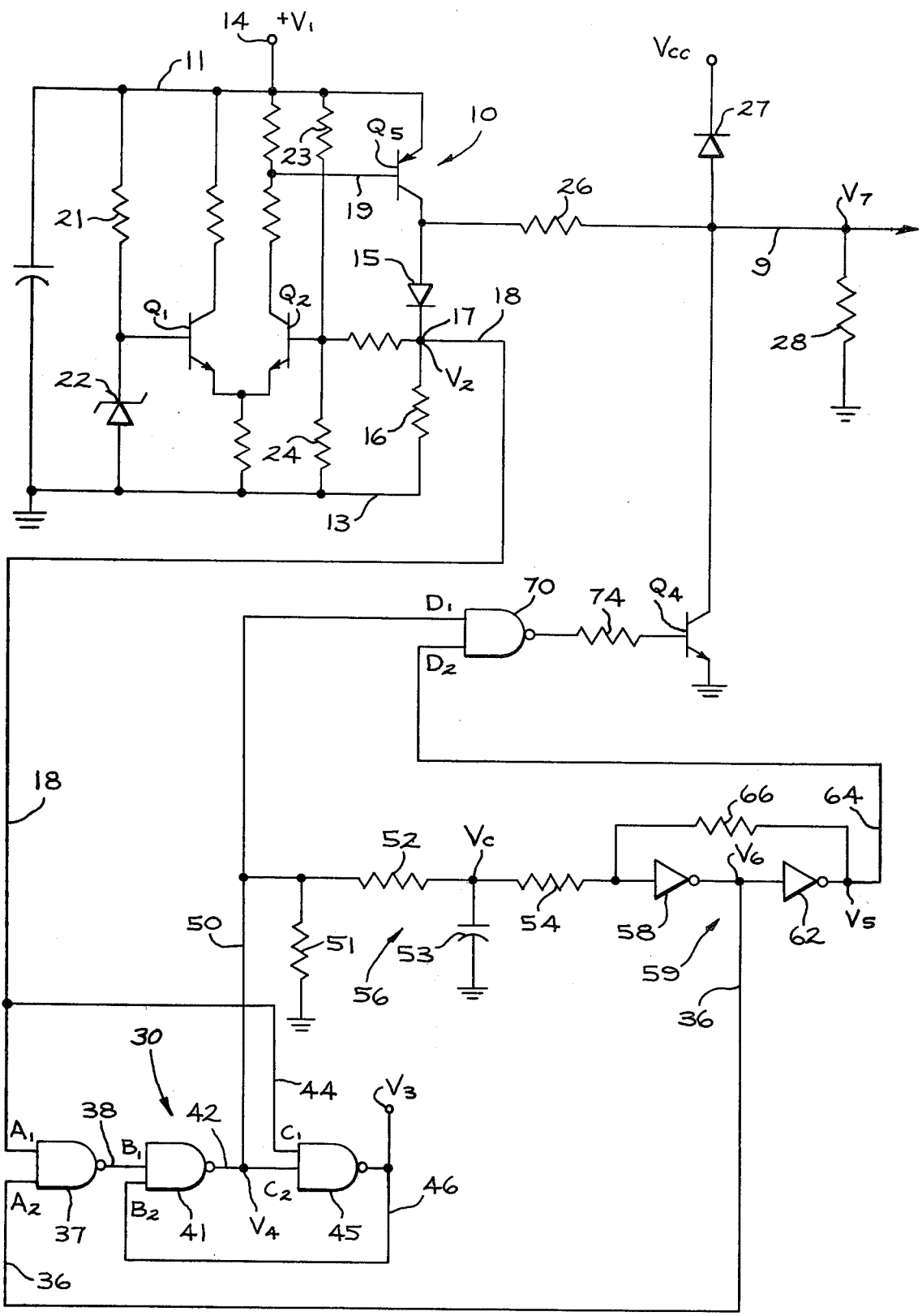

RESET SIGNAL GENERATOR

BACKGROUND OF THE INVENTION

This invention relates generally to a circuit for monitoring the power supply from which a microprocessor is energized and, more specifically, to a circuit for generating a signal which resets a microprocessor upon initial start-up of the power supply and whenever the supply voltage drops below a preselected level.

Microprocessors are designed to operate reliably only when a supply voltage of a preselected magnitude is continuously applied. Whenever the supply is initially powered up or when the supply drops below the preselected level the microprocessor must be reset to insure that it will operate predictably. Since the resetting process of the microprocessor requires a minimum time duration to be accomplished microprocessor manufacturers specify that the reset signal persist for a preselected minimum time duration in order to insure that bistable devices which make up the operating memory, registers and timing elements have sufficient time to settle into a known start-up condition.

Thus, it is an object of the invention to provide a reset signal generator circuit which insures that upon initial power up of the microprocessor a reset signal of a preselected duration is generated to allow for carrying out of the reset process. In addition, the circuit provides a reset signal in response to a drop in the power supply voltage below the preselected level, which reset signal is maintained for a minimum time irrespective of an abrupt return of the supply voltage to a value above the preselected level. Thus, notwithstanding a rapid power fluctuation, the required reset signal is applied to properly complete the resetting of the microprocessor.

SUMMARY OF THE INVENTION

These and other objects of the invention are accomplished by the provision of a reset signal generator circuit which responds to initial power turn-on and power supply fluctuations to generate reset control signals having a predetermined minimum duration, which signals may be inputted to a microprocessor to control the resetting thereof. The reset generator circuit of the invention incorporates a power monitor subcircuit which provides first and second logic level signals which specify the power supply as being above or below a preselected threshold level. A logic circuit comprising a series of interconnected NAND gates responds to the output signals generated by the power monitor subcircuit and to a signal from a capacitor charge monitor circuit. The capacitor charge monitor circuit develops logic signals which reflect the magnitude of the voltage across a capacitor which is part of a timing circuit. The control signal output from the logic circuit drives one input to a reset control gate and also controls the charge on the capacitor. The other input to the reset gate is also driven by the charge monitor circuit. The reset gate operates a switching element which provides the proper reset signal adapted for coupling to a microprocessor. The above circuitry provides a reset signal having a preselected minimum duration controlled by the charge-discharge characteristics of the timing circuit. The circuit thus provides a control which permits the microprocessor to process data only when the proper power supply conditions are present and which generates a reset signal of a preselected minimum duration upon initial or subsequent start ups of the microprocessor and after a power supply interruption or fluctuation.

BRIEF DESCRIPTION OF THE DRAWING

The drawing is a schematic diagram of an illustrative power supply monitor and reset signal generator circuit embodying the principles of this invention.

DETAILED DESCRIPTION OF THE INVENTION

In the following description, the terms ZERO, LOW, HIGH, and ONE will be used to describe logic levels. Since the circuits presented utilize positive logic conventions, the terms ZERO and LOW will mean no signal or a ground, and the terms HIGH and ONE will refer to a positive voltage level. The logical elements utilized in the circuit are, for the most part, NAND gates which have as their output a ZERO or LOW, if and only if all of the inputs thereto are ONE or HIGH. Otherwise, the output of a NAND gate is a ONE or HIGH.

The overall function of the circuit of the invention is to provide a LOW or reset voltage on line 9 whenever the power supply voltage $V_1$ is below a preselected safe level. In addition, the reset signal thus generated has a minimum duration so that should the power supply drop below the preselected safe level for a relatively short instant of insufficient duration to insure complete resetting of the microprocessor due to a transient on the line or for some other reason, the reset signal will nonetheless persist for a preselected minimum time to allow for proper completion of the reset function.

Referring to FIG. 1, the control circuit of the invention includes a power monitor subcircuit 10 coupled between a power supply input line 11 and a common ground line 13. The input power supply voltage $V_1$ is connected to the line 11 via the power supply terminal 14. The subcircuit 10 is of conventional design, does not form a part of the novel features of the invention and will therefore be only generally described herein. The subcircuit 10 functions to continuously monitor the power supply voltage $V_1$ and provide a signal $V_2$ on line 18 indicative of the magnitude of the power supply voltage. More specifically, the subcircuit 10 generally includes differentially connected transistors input $Q_1$ and $Q_2$ and follower transistor $Q_5$. The transistor $Q_1$ has its base electrode clampled to a reference potential by the combination of resistor 21 and zener diode 22, while the base of transistor $Q_2$ is biased by the voltage divider including the resistors 23 and 24 to a voltage which changes in response to changes in $V_1$. The transistor $Q_5$ has its base coupled to the collector circuit of transistor $Q_2$ via conductor 19. The emitter-collector circuit of $Q_5$ is connected in series with the diode 15 and voltage dropping resistor 16 across lines 11 and 13. Suffice it to say, when the power supply voltage $V_1$ is above a preselected set point $V_s$, $Q_5$ is turned on and a HIGH is present at the node 17 between the diode 15 and resistor 16. Conversely, if the power supply voltage $V_1$ at terminal 14 is below the preselected value $V_s$ the transistor $Q_5$ is cut off and the junction 17 is pulled to a ZERO logic level.

The voltage $V_2$ on line 18 is coupled to a logic means 30 including the gates 37, 41 and 45. More specifically, line 18 is connected to input $A_1$ of NAND gate 37, and via the conductor 44 to the $C_1$ input of NAND gate 45. The other input $A_2$ of NAND gate 37 is coupled by line 36 to a junction intermediate the output of inverter 58 and the input to inverter 62, the voltage at that junction being designated as $V_6$. The two inverters 58 and 62, along with the resistors 54 and 66, jointly form a capacitor voltage level monitoring circuit 59 in the form of a Schmitt trigger which monitors the voltage across a capacitor 53. The capacitor 53, along with an associated resistor network including resistors 51 and 52, form a timing circuit 56. The Schmitt trigger will not turn on unless the voltage across capacitor 53 is greater than a positive-going threshold $V_{c+}$ and will not turn off until the input voltage across capacitor 53 is less than a different negative-going threshold $V_{c-}$. Thus, the voltage across capacitor 53, $V_c$, serves to directly dictate the voltage $V_5$ on line 64 and $V_6$ on line 36. Specifically, the inverter 58 produces a HIGH on line 36 when the voltage across capacitor 53 is below $V_{c-}$, which HIGH on line 36 is translated to a LOW on line 64 by inverter 62. Conversely, when the voltage across capacitor 53 becomes greater than $V_{c+}$ the inverter 58 provides a LOW on line 36 ($V_6$) and a HIGH on line 64 ($V_5$).

The voltage $V_c$ across capacitor 53 charges and discharges in response to the instantaneous voltage on line 50, $V_4$, which in turn is connected to the output of NAND gate 41. Line 50 is also connected to one input $D_1$ of the reset control NAND gate 70, the other input $D_2$ being connected to line 64, $V_5$. The NAND gate 70, therefore, responds to the inputs $V_4$ and $V_5$ on lines 50 and 64, respectively. The output of NAND gate 70 is coupled through a resistor 74 to the base electrode of transistor $Q_4$ which controls the generation of the microprocessor reset signal $V_7$ on output line 9 across resistor 28. The diode 27 serves to limit or clamp the voltage on line 9 to the voltage $V_{cc}$. When line 9 goes above $V_{cc}$, diode 27 conducts. The resistor 26 prevents excessive current through the diode 27. The output of NAND gate 41 is also coupled to the input $C_2$ of the NAND gate 45.

The NAND gate 37, therefore, responds to the combined inputs from the power supply monitor subcircuit 10 via line 18 ($V_2$) and the output from the capacitor voltage monitor circuit 59 on line 36. The output of NAND gate 37, in turn, drives one input $B_1$ of the NAND gate 41, the other input $B_2$ of NAND gate 41 being coupled to the output $V_3$ of NAND gate 45 via line 46.

The logic means 30 is designed to respond to a positive-going change of the power supply (as indicated by a change in output from the power monitor subcircuit 10 from a LOW to a HIGH on line 18) and to a capacitor discharged signal on line 36 to immediately produce a first control signal or HIGH on line 50, this first control signal having the dual purpose of initiating a reset signal on line 9 and beginning the charging process of the capacitor 53. When capacitor 53 reaches a preselected voltage level, the reset signal on line 9 is terminated by a signal (HIGH) on line 64. The logic means 30, moreover, responds to a negative-going change in the supply voltage (as indicated by a change in output of the monitor subcircuit 10 from a HIGH to a LOW) and the coincident receipt of a capacitor charged signal on line 36 to generate a second control signal or LOW on line 50 which operates to initiate another reset signal on line 9 but to delay the generation of said first control signal to terminate this reset signal until a capacitor discharged signal has been received on line 36. In this fashion, the reset signals thus generated are made to have a minimum duration determined by the charge-discharge time of the capacitor.

In operation, the circuit of the invention generates a long reset signal on line 9 whenever the circuit is initially powered up. The reset pulse is characterized by a LOW on line 9, the duration of the reset signal being governed by the time needed for capacitor 53 to charge to a preselected voltage. This takes place as follows: Assuming power has been off for an appreciable period of time ($V_1=0$, $V_c=0$) as the voltage $V_1$ rises above the preselected trigger level of the power monitor subcircuit 10, the transistor $Q_5$ turns on and the voltage $V_2$ at node 17 goes HIGH. This HIGH is transmitted to the input $A_1$ of NAND gate 37 by line 18 and to the input terminal $C_1$ of NAND gate 45 via lines 18 and 44.

Since the control capacitor 53 at turn on of power is still in a discharged condition, the voltage $V_c$ is below the threshold of the Schmitt trigger 59 and the voltages $V_6$ and $V_5$ are, respectively, ONE and ZERO. The voltage $V_6$ is coupled to input terminal $A_2$ of gate 37 via line 36 and in combination with the HIGH on input $A_1$ causes the output of gate 37 on line 38 to be ZERO. This ZERO at input $B_1$ of gate 42 causes the output of gate 41, $V_4$, to switch HIGH. The voltage $V_4$ on line 50 serves a dual function; it provides one input to NAND gate 70 and also acts as the voltage source for charging capacitor 53. Thus, the HIGH on line 50 is coupled to input $D_1$ of gate 70, the other input to gate 70 being the LOW voltage $V_5$ on line 64, the latter resulting from the discharged state of capacitor 53.

The NAND gate 70, therefore, provides a ONE output which, in turn, biases transistor $Q_4$ on, thereby providing a reset voltage on line 9 by holding it at or near electrical ground. This LOW reset voltage on line 9 may be coupled to a microprocessor input port to reset it in anticipation of the processing of data.

The above conditions persist for the time period required to charge the capacitor 53 from line 50 to the positive-going threshold of the Schmitt trigger 59 at which time the outputs of the inverters 58 and 62 are switched to their opposite states. The time required for capacitor 53 to charge to this threshold level, of course, is dependent on the charging time constant of the timing circuit 56.

When the capacitor voltage 53 passes through the threshold level of the Schmitt trigger 59, the inverters 58 and 62, abruptly change logic states, $V_6$ becoming LOW and $V_5$ HIGH.

The HIGH on line 64 is transmitted to the input $D_2$ of NAND gate 70, which along with the HIGH on the $D_1$ input thereof switches its output LOW. The LOW output of NAND gate 70 is transmitted via resistor 74 to the base of $Q_4$, cutting it off and terminating the reset or ground voltage on line 9 which rises to a HIGH. This HIGH serves as an enabling microprocessor signal to permit the beginning of processing of data.

The LOW on line 36 resulting from the charging of capacitor 53 above the threshold level is coupled back via line 36 to NAND gate 37 which changes its output from LOW to HIGH, thus providing a HIGH input to terminal $B_1$ of gate 41. The output of gate 41 which is HIGH remains unchanged for the present; but gate 41 is thereby preset to detect a subsequent change in the state of the power monitor circuit 10 as will be explained hereinafter.

Recapitulating, when power is initially turned on, a HIGH is generated on lines 18 and 44 in response to $V_1$ rising above the threshold level of the power monitor subcircuit 10. A HIGH is generated by gates 37 and 41 on line 50 which acts as one input to gate 70, the other input to gate 70 being a LOW on line 64. The resulting HIGH output from gate 70 translates into a reset voltage on line 9 which persists until capacitor 53 charges sufficiently from line 50 to switch the voltage on line 64 to a HIGH which changes the state of gate 70 and terminates the reset signal on line 9.

Assuming the circuit has been operating normally for some time, when the power supply voltage $V_1$ drops below the threshold level $V_s$ of the power monitor subcircuit 10, transistor $Q_5$ is cut off and junction 17 is pulled to LOW logic level. This LOW is transmitted via conductors 18 and 44 to the inputs $A_1$ of gate 37 and $C_1$ of gate 45. Since the $A_2$ input of gate 37 is already LOW, the output on line 38 remains HIGH. However, the output of gate 45 changes from LOW to HIGH when the line 44 goes LOW and this HIGH is coupled via line 46 to the input $B_2$ of gate 41. Since both the inputs to NAND gate 41 are now HIGH, its output $V_4$ on line 50 switches LOW. This LOW on line 50 immediately changes the output of gate 70 from LOW to HIGH, thereby providing a LOW or reset signal on line 9 by turning on transistor $Q_4$.

An important feature of the invention is to be noted at this stage. Once the reset pulse has started by switching the output of NAND gate 70 HIGH in response to a sudden drop in $V_1$, the reset level cannot be terminated for a preselected time determined by the discharge rate of the timing circuit 56. More specifically, while input $D_1$ to gate 70 changes immediately to ZERO in response to a drop in voltage $V_1$ below $V_s$, as explained above, it cannot change back to a HIGH so as to terminate the reset signal until capacitor 53 has discharged below the negative-going threshold of the Schmitt trigger 59. This is so because NAND gate 37 has its input $A_2$ held at a LOW logic level via line 36 until capacitor 53 has discharge. With input $A_2$ LOW, a return of the $A_1$ input to a HIGH maintains a HIGH on line 38. However, the input $B_2$ of gate 41 is also held HIGH in response to the LOW on input $C_2$ of gate 45. The resulting HIGH inputs to gate 41 do not permit line 50 to return to a HIGH level but, rather, maintain it and, consequently, input $D_1$ of gate 70 LOW. Thus, a rapid fluctuation of the power supply below and then above the preselected threshold does not result in a correspondingly rapid or short duration reset pulse. Once begun, in response to a drop in the power supply voltage, the reset voltage on line 9 is maintained until the capacitor 53 discharges sufficiently to switch the Schmitt trigger 59, at which time line 36 goes HIGH, line 38 goes LOW, which in turn drives line 50 HIGH to provide a HIGH on input $D_1$ to NAND gate 70 and to begin recharging the capacitor 53. As the capacitor goes through the threshold of the Schmitt trigger, line 64 and consequently the input $D_2$ to NAND gate 70 becomes HIGH. The output of NAND gate 70 goes LOW, $Q_4$ is turned off and the reset signal on line 9 is terminated. The above process repeats itself during operation of the circuit.

Although the invention has been described with reference to specific embodiments thereof, numerous modifications are possible without departing from the invention, and it is desirable to cover all modifications falling within the spirit and scope of this invention.

What is claimed is:

1. A reset signal generator circuit adapted for coupling to a power supply comprising:

a capacitor having a characteristic charge-discharge time representative of the time required to charge said capacitor from a discharged voltage level to a voltage level above a preselected level or to discharge said capacitor from a voltage level above said preselected level to its discharged voltage level;

circuit means for generating a capacitor charged signal indicating a voltage above said preselected level across said capacitor and a capacitor discharged signal indicating a voltage level across said capacitor below said preselected level;

a power monitor circuit responsive to changes in the voltage level of the supply to provide a first signal when the supply is above a preselected threshold and a second signal when the supply is below said threshold;

logic means responsive to the concurrent receipt of said first signal and said capacitor discharged signal to immediately generate a first control signal, responsive to said second signal and said capacitor charged signal to generate a second control signal, and responsive to the concurrent receipt of said first signal and said capacitor charged signal to delay the generation of said first control signal until said capacitor discharged signal is received, said capacitor coupled to said logic means to charge in response to said first control signal; and reset gate means responsive to the concurrent receipt of (a) said first control signal and said capacitor discharged signal, and (b) said second control signal and said capacitor charged signal to control the initiation of a reset signal and responsive to the concurrent receipt of said first control signal and said capacitor charged signal to control the termination of said reset signal, whereby said reset signal persists for a minimum time determined by the charge-discharge time of said capacitor.

2. The combination recited in claim 1 wherein said logic means comprises:

a first gate having a first input coupled to said power monitor circuit, and a second input coupled to said circuit means;

a second gate having a first input coupled to the output of said first gate, the output of said second gate providing said first control signal; and a third gate having a first input coupled to the output of said second gate, and a second input coupled to said power monitor circuit, the output of said third gate being coupled to the other input of said second gate.

3. The combination recited in claim 2 wherein said first, second and third gates are NAND gates.

4. The combination recited in claim 2 or 3 wherein said capacitor is coupled to the output of said second gate so as to be charged and discharged thereby.

5. The combination recited in claim 2 or 3 wherein said reset gate means is a fourth gate having one input coupled to the output of said second gate, another input coupled to said circuit means and further including a switching element driven from the output of said fourth gate.

6. The combination recited in claim 3 wherein said circuit means comprises a Schmitt trigger circuit including two inverters providing oppositely sensed logic level outputs.

7. The combination recited in claim 6 wherein the output of one of said inverters is coupled as an input to said first gate, and the output of said second inverter is coupled to said reset gate means.

8. The combination recited in claim 4 wherein said reset gate means is a fourth gate having one input coupled to the output of said second gate, another input coupled to said circuit means and further including a switching element driven from the output of said fourth gate.

* * * * *